United States Patent
Escher et al.

(10) Patent No.: US 7,291,566 B2
(45) Date of Patent: Nov. 6, 2007

(54) BARRIER LAYER FOR A PROCESSING ELEMENT AND A METHOD OF FORMING THE SAME

(75) Inventors: Gary Escher, Hampstead, NH (US); Mark A. Allen, Essex, ME (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/550,215

(22) PCT Filed: Mar. 18, 2004

(86) PCT No.: PCT/US2004/006080

§ 371 (c)(1),
(2), (4) Date: Sep. 22, 2005

(87) PCT Pub. No.: WO2004/095532

PCT Pub. Date: Nov. 4, 2004

(65) Prior Publication Data

US 2006/0183344 A1    Aug. 17, 2006

Related U.S. Application Data

(60) Provisional application No. 60/458,439, filed on Mar. 31, 2003.

(51) Int. Cl.
*H01L 21/31* (2006.01)

(52) U.S. Cl. ............... 438/758; 438/761; 438/762; 438/766; 438/770; 438/771; 438/768; 257/360; 257/E21.589

(58) Field of Classification Search .......... 438/758, 438/761, 762, 765, 770, 771, 772, 768; 257/360

See application file for complete search history.

(56) References Cited

U.S. PATENT DOCUMENTS

| | | | |
|---|---|---|---|
| 4,310,390 A | 1/1982 | Bradley et al. | |
| 4,357,387 A | 11/1982 | George et al. | ............. 442/71 |
| 4,469,619 A | 9/1984 | Ohno et al. | |
| 4,593,007 A | 6/1986 | Novinski | |
| 4,612,077 A | 9/1986 | Tracy et al. | |
| 4,649,858 A | 3/1987 | Sakai et al. | |

(Continued)

FOREIGN PATENT DOCUMENTS

DE    94 21 671    7/1996

(Continued)

OTHER PUBLICATIONS

Production drawing for Deposition Shield, Upper believed to be sold in the U.S. on Apr. 12, 2000.

(Continued)

*Primary Examiner*—Asok K. Sarkar
*Assistant Examiner*—Victor V. Yevsikov
(74) *Attorney, Agent, or Firm*—Oblon, Spivak, McClelland, Maier & Neustadt, P.C.

(57) ABSTRACT

In order to mitigate erosion of exposed processing elements in a processing system by the process and any subsequent contamination of the substrate in the processing system, processing elements exposed to the process are coated with a protective barrier. The protective barrier comprises a protective layer that is resistant to erosion by the plasma, and a bonding layer that improves the adhesion of the protective layer to the processing element to mitigate possible process contamination by failure of the protective layer.

13 Claims, 3 Drawing Sheets

U.S. PATENT DOCUMENTS

| | | | |
|---|---|---|---|
| 4,842,683 A | 6/1989 | Cheng et al. | |
| 4,877,757 A | 10/1989 | York et al. | |
| 5,000,113 A | 3/1991 | Wang et al. | |
| 5,074,456 A | 12/1991 | Degner et al. | |
| 5,334,462 A | 8/1994 | Vine et al. | |
| 5,362,335 A | 11/1994 | Rungta | |
| 5,366,585 A | 11/1994 | Robertson et al. | |
| 5,367,838 A | 11/1994 | Visaisouk et al. | |
| 5,423,936 A | 6/1995 | Tomita et al. | |
| 5,426,310 A | 6/1995 | Tamada et al. | |
| 5,484,752 A | 1/1996 | Waku et al. | |
| 5,494,713 A | 2/1996 | Ootuki | |
| 5,521,790 A | 5/1996 | Ruckel et al. | 361/234 |
| 5,551,190 A | 9/1996 | Yamagishi et al. | |
| 5,556,501 A | 9/1996 | Collins et al. | |
| 5,614,055 A | 3/1997 | Fairbairn et al. | |
| 5,616,229 A * | 4/1997 | Samsonov et al. | 205/107 |
| 5,637,237 A | 6/1997 | Oehrlein et al. | |
| 5,641,375 A | 6/1997 | Nitescu et al. | |
| 5,651,723 A | 7/1997 | Bjornard et al. | |
| 5,680,013 A | 10/1997 | Dornfest et al. | |
| 5,725,960 A | 3/1998 | Konishi et al. | |
| 5,759,360 A | 6/1998 | Ngan et al. | |
| 5,798,016 A | 8/1998 | Oehrlein et al. | |
| 5,834,070 A | 11/1998 | Movchan et al. | |
| 5,851,343 A | 12/1998 | Hsu et al. | |
| 5,868,848 A | 2/1999 | Tsukamoto | |
| 5,879,575 A | 3/1999 | Tepman et al. | |
| 5,885,356 A | 3/1999 | Zhao et al. | |
| 5,885,402 A | 3/1999 | Esquibel | 156/345.24 |
| 5,891,253 A | 4/1999 | Wong et al. | |
| 5,892,278 A | 4/1999 | Horita | 257/706 |
| 5,894,887 A | 4/1999 | Kelsey et al. | |
| 5,895,586 A | 4/1999 | Kaji et al. | |
| 5,900,064 A | 5/1999 | Kholodenko | |
| 5,902,763 A | 5/1999 | Waku et al. | |
| 5,911,852 A | 6/1999 | Katayama et al. | |
| 5,919,332 A | 7/1999 | Koshiishi et al. | |
| 5,925,228 A | 7/1999 | Panitz et al. | 204/484 |
| 5,944,902 A | 8/1999 | Redeker et al. | |
| 5,948,521 A | 9/1999 | Dlugosch et al. | |
| 5,952,054 A | 9/1999 | Sato et al. | |
| 5,952,060 A | 9/1999 | Ravi | |
| 5,955,182 A | 9/1999 | Yasuda et al. | |
| 5,968,377 A | 10/1999 | Yuasa et al. | |
| 5,985,102 A | 11/1999 | Leiphart | |
| 5,994,662 A | 11/1999 | Murugesh | |
| 6,068,729 A | 5/2000 | Shrotriya | 156/345.26 |
| 6,073,449 A | 6/2000 | Watanabe et al. | 62/3.2 |
| 6,096,161 A | 8/2000 | Kim et al. | |
| 6,106,625 A | 8/2000 | Koai et al. | |
| 6,110,287 A | 8/2000 | Arai et al. | |
| 6,120,640 A | 9/2000 | Shih et al. | |
| 6,120,955 A | 9/2000 | Tokutake et al. | |
| 6,123,791 A | 9/2000 | Han et al. | |
| 6,123,804 A | 9/2000 | Babassi et al. | |
| 6,129,808 A | 10/2000 | Wicker et al. | |
| 6,139,983 A | 10/2000 | Ohashi et al. | |
| 6,143,646 A | 11/2000 | Wetzel | |
| 6,170,429 B1 | 1/2001 | Schoepp et al. | |
| 6,176,969 B1 | 1/2001 | Park et al. | |
| 6,182,603 B1 | 2/2001 | Shang et al. | |
| 6,210,486 B1 | 4/2001 | Mizukami et al. | |
| 6,221,202 B1 | 4/2001 | Walko, II | |
| 6,246,479 B1 | 6/2001 | Jung et al. | |
| 6,264,788 B1 | 7/2001 | Tomoyasu et al. | |
| 6,265,757 B1 | 7/2001 | Brady et al. | |
| 6,266,133 B1 | 7/2001 | Miyajima et al. | |
| 6,296,740 B1 | 10/2001 | Xie et al. | |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1 | 5/2002 | Haino et al. | |
| 6,383,964 B1 | 5/2002 | Nakahara et al. | |
| 6,394,026 B1 | 5/2002 | Wicker et al. | |
| 6,413,578 B1 | 7/2002 | Stowell et al. | |
| 6,444,083 B1 | 9/2002 | Steger et al. | |
| 6,514,377 B1 | 2/2003 | Morimoto | |
| 6,519,037 B2 | 2/2003 | Jung et al. | |
| 6,527,911 B1 | 3/2003 | Yen et al. | |
| 6,533,910 B2 | 3/2003 | O'Donnell et al. | |
| 6,537,429 B2 | 3/2003 | O'Donnell et al. | |
| 6,544,380 B2 | 4/2003 | Tomoyasu et al. | |
| 6,554,906 B1 | 4/2003 | Kuibira et al. | |
| 6,562,186 B1 | 5/2003 | Saito et al. | 156/345.24 |
| 6,570,654 B2 | 5/2003 | Jung et al. | |
| 6,583,064 B2 | 6/2003 | Wicker et al. | |
| 6,590,660 B2 | 7/2003 | Jung et al. | |
| 6,613,204 B2 | 9/2003 | Xie et al. | |
| 6,613,442 B2 | 9/2003 | O'Donnell et al. | |
| 6,641,697 B2 | 11/2003 | Han et al. | |
| 6,663,714 B2 | 12/2003 | Mizuno et al. | |
| 6,695,929 B2 | 2/2004 | Kanekiyo et al. | |
| 6,726,801 B2 | 4/2004 | Ahn | |
| 6,733,620 B1 | 5/2004 | Sugiyama et al. | |
| 6,738,862 B1 | 5/2004 | Ross et al. | |
| 6,776,873 B1 | 8/2004 | Sun et al. | |
| 6,783,863 B2 | 8/2004 | Harada et al. | |
| 6,783,875 B2 | 8/2004 | Yamada et al. | |
| 6,798,519 B2 | 9/2004 | Nishimoto et al. | |
| 6,805,952 B2 | 10/2004 | Chang et al. | |
| 6,806,949 B2 | 10/2004 | Ludviksson et al. | |
| 6,811,651 B2 | 11/2004 | Long | |
| 6,830,622 B2 | 12/2004 | O'Donnell et al. | |
| 6,833,279 B2 | 12/2004 | Choi | |
| 6,837,966 B2 | 1/2005 | Nishimoto et al. | |
| 6,852,433 B2 | 2/2005 | Maeda | |
| 6,863,594 B2 | 3/2005 | Preising | |
| 6,875,477 B2 | 4/2005 | Trickett et al. | |
| 6,884,516 B2 | 4/2005 | Harada et al. | |
| 6,894,769 B2 | 5/2005 | Ludviksson et al. | |
| 2001/0003271 A1 | 6/2001 | Otsuki | |
| 2001/0050144 A1 | 12/2001 | Nishikawa et al. | |
| 2002/0076508 A1 | 6/2002 | Chiang et al. | |
| 2002/0086118 A1 | 7/2002 | Chang et al. | |
| 2002/0086501 A1 | 7/2002 | O'Donnell et al. | |
| 2002/0086545 A1 | 7/2002 | O'Donnell et al. | |
| 2002/0086553 A1 | 7/2002 | O'Donnell et al. | |
| 2002/0090464 A1 | 7/2002 | Jiang et al. | |
| 2002/0142611 A1 | 10/2002 | O'Donnell et al. | |
| 2002/0177001 A1 | 11/2002 | Harada et al. | 428/469 |
| 2003/0010446 A1 | 1/2003 | Kajiyama et al. | |
| 2003/0029563 A1 | 2/2003 | Kaushal et al. | |
| 2003/0084848 A1 | 5/2003 | Long | |
| 2003/0113479 A1 | 6/2003 | Fakuda et al. | 427/569 |
| 2003/0188972 A1 * | 10/2003 | Shatrov et al. | 205/91 |
| 2003/0200929 A1 | 10/2003 | Otsuki | |
| 2004/0026372 A1 | 2/2004 | Takenaka et al. | |
| 2004/0035364 A1 | 2/2004 | Tomoyoshi et al. | |
| 2004/0050495 A1 | 3/2004 | Sumiya et al. | |
| 2004/0060516 A1 | 4/2004 | Nishimoto et al. | |
| 2004/0060656 A1 | 4/2004 | Saigusa et al. | |
| 2004/0060657 A1 | 4/2004 | Saigusa et al. | |
| 2004/0060658 A1 | 4/2004 | Nishimoto et al. | |
| 2004/0060661 A1 | 4/2004 | Nishimoto et al. | |
| 2004/0060779 A1 * | 4/2004 | Kreger | 188/71.5 |
| 2004/0061447 A1 | 4/2004 | Saigusa et al. | |
| 2004/0063333 A1 | 4/2004 | Saigusa et al. | |
| 2004/0072426 A1 | 4/2004 | Jung | |
| 2004/0081746 A1 | 4/2004 | Imafuku | |
| 2004/0083970 A1 | 5/2004 | Imafuku et al. | |
| 2004/0125359 A1 | 7/2004 | Ludviksson et al. | |
| 2004/0168640 A1 | 9/2004 | Muto et al. | |

| | | | |
|---|---|---|---|
| 2004/0173155 A1 | 9/2004 | Nishimoto et al. | |
| 2004/0216667 A1 | 11/2004 | Mitsuhashi et al. | |
| 2005/0103268 A1 | 5/2005 | Nishimoto et al. | |
| 2005/0103275 A1 | 5/2005 | Sasaki et al. | |
| 2005/0150866 A1 | 7/2005 | O'Donnell | 216/67 |
| 2006/0134919 A1* | 6/2006 | Hamelin et al. | 438/706 |

FOREIGN PATENT DOCUMENTS

| | | |
|---|---|---|
| EP | 0 508 731 | 10/1992 |
| EP | 0 573 057 | 12/1993 |
| EP | 0 814 495 | 6/1997 |
| EP | 0 799 904 | 10/1997 |
| EP | 0 841 838 | 5/1998 |
| EP | 1 069 603 | 1/2001 |
| EP | 1 081 749 | 7/2001 |
| EP | 1 156 130 | 11/2001 |
| GB | 2 252 567 | 8/1992 |
| JP | 61-207566 | 9/1986 |
| JP | 64-039728 | 2/1989 |
| JP | 1-312087 | 12/1989 |
| JP | 02-267967 | 11/1990 |
| JP | 03-115535 | 5/1991 |
| JP | 4-238882 | 8/1992 |
| JP | 05-070922 | 3/1993 |
| JP | 05-117064 | 5/1993 |
| JP | 05-121360 | 5/1993 |
| JP | 05-198532 | 8/1993 |
| JP | 05-238859 | 9/1993 |
| JP | 06-057396 | 3/1994 |
| JP | 06-136505 | 5/1994 |
| JP | 06-142822 | 5/1994 |
| JP | 06-256926 | 9/1994 |
| JP | 07-058013 A | 3/1995 |
| JP | 07-126827 | 5/1995 |
| JP | 07-176524 | 7/1995 |
| JP | 07-226378 | 8/1995 |
| JP | 07-245295 | 9/1995 |
| JP | 08-037180 | 2/1996 |
| JP | 08-041309 | 2/1996 |
| JP | 08-081777 | 3/1996 |
| JP | 08-268751 | 10/1996 |
| JP | 08-339895 | 12/1996 |
| JP | 09-069554 | 3/1997 |
| JP | 09-272987 | 10/1997 |
| JP | 10-004083 | 1/1998 |
| JP | 10-045461 | 2/1998 |
| JP | 10-045467 | 2/1998 |
| JP | 10-130884 | 5/1998 |
| JP | 10-214819 | 8/1998 |
| JP | 10-251871 | 9/1998 |
| JP | 11-080925 | 3/1999 |
| JP | 11-207161 | 8/1999 |
| JP | 11-233292 | 8/1999 |
| JP | 11-312646 | 11/1999 |
| JP | 2000-124197 | 4/2000 |
| JP | 2000-303180 | 10/2000 |
| JP | 2001-031484 | 2/2001 |
| JP | 2001-152307 | 6/2001 |
| JP | 2001-164354 | 6/2001 |
| JP | 2001-226773 | 8/2001 |
| JP | 2002-151473 | 5/2002 |
| KR | 1998-063542 | 10/1998 |
| KR | 1999-008142 | 1/1999 |
| KR | 2002-0027373 | 4/2002 |
| KR | 10/2004-0007601 | 1/2004 |
| WO | 99/50886 | 10/1999 |
| WO | 01/42526 | 6/2001 |
| WO | 02/39495 | 5/2002 |
| WO | 02/48421 | 6/2002 |
| WO | 2004/030011 | 4/2004 |
| WO | 2004/030012 | 4/2004 |
| WO | 2004/030013 | 4/2004 |
| WO | 2004/030014 | 4/2004 |
| WO | 2004/030015 | 4/2004 |
| WO | 2004/030020 | 4/2004 |
| WO | 2004/030426 | 4/2004 |
| WO | 2004/095530 | 11/2004 |
| WO | 2004/095532 | 11/2004 |

OTHER PUBLICATIONS

Production drawing for Deposition Shield believed to be sold in the U.S. prior to Sep. 30, 2001.

Production drawing for Upper Electrode believed to be sold in the U.S. prior to Sep. 30, 2001.

JIS Using Series, "Spraying Techniques Manual.", p. 95 (Oct. 30, 1998, Japanese Standard Association), with English Translation.

Kim, Hee Jee, "Plasma-Sprayed Alumina-Yttria Ceramic Coatings for Cavitation-Erosion Protection," Sep. 1989, pp. 139-146.

* cited by examiner

BARRIER LAYER FOR A PROCESSING ELEMENT AND A METHOD OF FORMING THE SAME

CROSS REFERENCE TO RELATED APPLICATIONS

This application claims priority to and is related to U.S. Provisional Application Ser. No. 60/458,439, filed on Mar. 31, 2003. The contents of this application is incorporated herein by reference.

FIELD OF THE INVENTION

The present invention relates to a barrier layer for a processing element and a method of forming the same, and more particularly to a barrier layer for a processing element comprising an adhesion layer and a protective layer and a method of forming the same.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

A barrier layer and a method of forming the same is described.

A protective barrier on a processing element utilized in a processing system for performing a process comprising: a bonding layer coupled to the processing element, wherein the bonding layer comprises a layer formed using plasma electrolytic oxidation; and a protective layer coupled to the bonding layer and configured to be exposed to the process.

A method of forming a protective barrier on a processing element utilized in a processing system for performing a process comprising: applying a bonding layer to the processing element, wherein the application of the bonding layer comprises plasma electrolytic oxidation; and applying a protective layer to the bonding layer.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
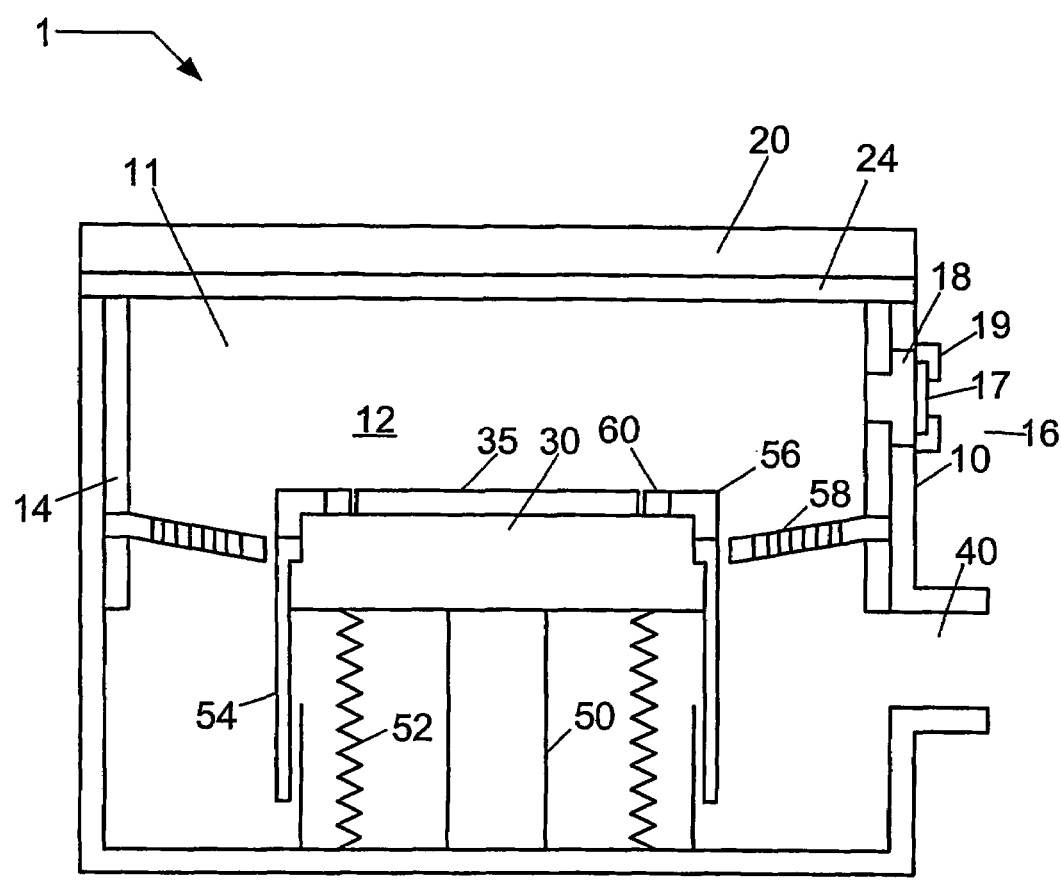
FIG. 1 illustrates a schematic block diagram of a plasma processing system according to an embodiment of the present invention.

A plasma processing system 1, such as one capable of plasma etching, is depicted in FIG. 1 comprising a processing chamber 10, an upper assembly 20, an upper wall 24, a substrate holder 30 for supporting a substrate 35, and a pumping duct 40 coupled to a vacuum pump (not shown) for providing a reduced pressure atmosphere 11 in processing chamber 10. Processing chamber 10 can, for example, facilitate the formation of a processing plasma in a process space 12 adjacent substrate 35. The plasma processing system 1 can be configured to process various substrates (i.e. 200 mm substrates, 300 mm substrates, or larger).

In the illustrated embodiment, upper assembly 20 can comprise at least one of a cover, a gas injection assembly, and an upper electrode impedance match network. For example, the upper wall 24 can, for example, be configured to comprise an electrode having an electrode plate that is coupled to a radio frequency (RF) source, and therefore facilitate an upper electrode for the plasma processing system 1. In another alternate embodiment, the upper assembly 20 comprises a cover and an upper wall 24, wherein the upper wall 24 is maintained at an electrical potential equivalent to that of the processing chamber 10. For example, the processing chamber 10, the upper assembly 20, and the upper wall 24 can be electrically connected to ground potential, and facilitate a grounded wall for the plasma processing system 1.

Processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the processing chamber 10. Optical window deposition shield 18 can extend through an opening 70 within deposition shield 14. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the processing chamber 10, and configured to seal the vertical translational device 50 from the reduced pressure atmosphere 11 in processing chamber 10. Additionally, a bellows shield 54 can, for example, be coupled to the substrate holder 30 and configured to protect the bellows 52 from a processing plasma. Alternately, substrate holder does not comprise a vertical translational device and bellows.

Substrate holder 10 can further be coupled to a focus ring 60, and, optionally, a shield ring 56. Furthermore, a baffle plate 58 can, for example, extend about a periphery of the substrate holder 30.

Substrate 35 can be, for example, transferred into and out of processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from the substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system to substrate holder 30. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermoelectric heaters/coolers can be included.

In the illustrated embodiment, shown in FIG. 1, substrate holder 30 can comprise an electrode (not shown) through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz, for example, 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, transformer coupled plasma (TCP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Referring still to FIG. 1, plasma processing device 1 comprises one or more processing elements, each of which can be exposed to the processing plasma in process space 12, and are, therefore, subject to potential erosion during processing. For example, the one or more processing elements can comprise an electrode plate, a deposition shield, a chamber liner, a bellows shield, a baffle plate, an optical window deposition shield, a shield ring, a focus ring, etc. In order to mitigate erosion of the exposed processing elements by the processing plasma and any subsequent contamination of the substrate, the processing elements are coated with a protective barrier.

Figure 2:
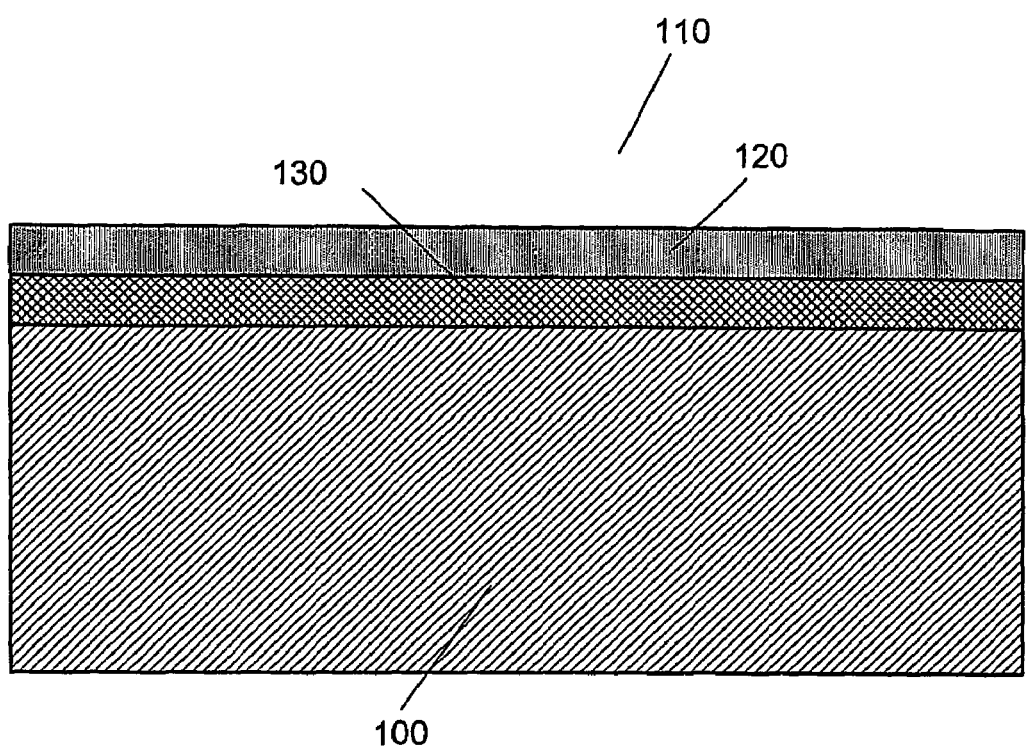
FIG. 2 presents an expanded cross-sectional view of a portion of a processing element in a plasma processing system as shown in FIG. 1.

In an embodiment, as depicted in FIG. 2, a processing element 100 comprises a protective barrier 110 having a protective layer 120 that is resistant to erosion by the plasma, and a bonding layer 130 that improves the adhesion of the protective layer 120 to the processing element 100 to mitigate possible process contamination by failure of the protective layer.

The protective layer 120 can, for example, comprise at least one of $Al_2O_3$ and $Y_2O_3$. In another embodiment of the present invention, the protective layer comprises at least one of a III-column element (column III of periodic table) and a Lanthanon element. In another embodiment of the present invention, the III-column element comprises at least one of Yttrium, Scandium, and Lanthanum. In another embodiment of the present invention, the Lanthanon element comprises at least one of Cerium, Dysprosium, and Europium. In another embodiment of the present invention, the compound forming protective layer comprises at least one of Yttria ($Y_2O_3$), $Sc_2O_3$, $Sc_2F_3$, $YF_3$, $La_2O_3$, $CeO_2$, $Eu_2O_3$, and $Dy_2O_3$.

The bonding layer is, for example, Keronite (surface coating treatment commercially available from Keronite Limited, Advanced Surface Technology, PO Box 700, Granta Park, Great Abington, Cambridge CB1 6ZY, UK). In general, the bonding layer can comprise three layers including: a thin transition layer between the (metal) processing element and the ceramics, a dense primary layer that provides hardness, and a softer, more porous outer layer. The softer, more porous outer layer, which typically comprises up to 10 to 20% of the total bonding layer thickness, can be removed by polishing in order to provide a bonding surface for the application of the protective layer. Since the bonding layer, as described, is a conversion layer, it possesses improved adhesion properties due to molecular bonding.

Figure 3:
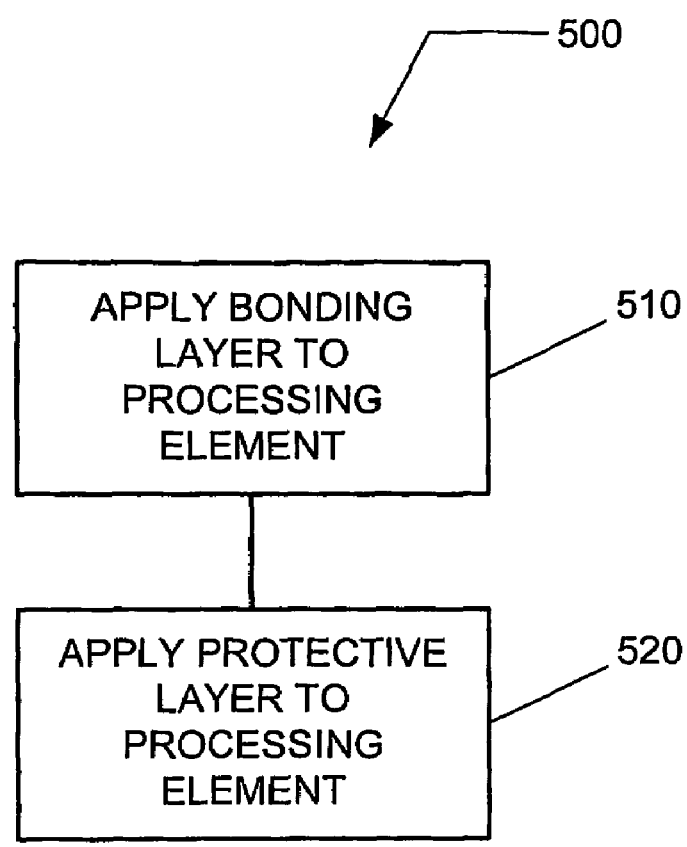
FIG. 3 presents a method of forming a protective layer on a processing element in a plasma processing system according to an embodiment of the present invention.

FIG. 3 presents a method of forming the protective barrier on a processing element. The method is presented in flow chart 500 beginning with step 510, wherein the bonding layer is applied to at least one surface of the processing element. The processing element can, for example, be fabricated using at least one of machining, polishing, and grinding. For example, the processing element described above can be machined according to specifications set forth on a mechanical drawing, using conventional techniques including a mill, etc. The techniques for machining a component using, for example, a mill, are well known to those skilled in the art of machining such materials. The processing element can comprise at least one of a metal, a silicon based material, and a ceramic. The processing element can, for example, comprise aluminum. The bonding layer can comprise Keronite. For example, a Keronite layer can be formed via plasma electrolytic oxidation (PEO) that includes masking the processing element and submersing the processing element in a wet chemistry electrolytic bath for transforming the metallic surface into a hard, dense and adhesive ceramic by plasma discharge in the liquid electrolyte. Optionally, the (third) softer, more porous layer in the bonding layer can be removed by polishing.

In step 520, the protective layer is applied to the bonding layer. The protective layer comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A protective barrier on a processing element utilized in a processing system for performing a process, comprising:
    a bonding layer coupled to said processing element, wherein said bonding layer comprises a layer formed using plasma electrolytic oxidation and includes a transition layer, a primary layer, and an outer layer; and
    a protective layer coupled to said bonding layer and configured to be exposed to said process, wherein said protective layer is coupled to said bonding layer after at least a portion of said outer layer is removed using at least one of polishing, grinding, and grit blasting.

2. The protective barrier as recited in claim 1, wherein said protective layer comprises a compound containing at least one of a III-column element and a Lanthanon element.

3. The protective barrier as recited in claim 2, wherein said III-column element comprises at least one of Yttrium, Scandium, and Lanthanum.

4. The protective barrier as recited in claim 2, wherein said Lanthanon element comprises at least one of Cerium, Dysprosium, and Europium.

5. The protective barrier as recited in claim 1, wherein said protective layer comprises at least one of $Al_2O_3$, Yttria ($Y_2O_3$), $Sc_2O_3$, $Sc_2F_3$, $YF_3$, $La_2O_3$, $CeO_2$, $Eu_2O_3$, and $Dy_2O_3$.

6. The protective barrier as recited in claim 1, wherein the processing element comprises at least one of a metal, a silicon based material, and a ceramic.

7. The protective barrier as recited in claim 1, wherein the processing element comprises aluminum.

8. The protective barrier as recited in claim 1, wherein the process comprises a plasma.

9. A method of forming a protective barrier on a processing element utilized in a processing system for performing a process comprising:
    applying a bonding layer to said processing element, wherein said application of said bonding layer comprises plasma electrolytic oxidation and said bonding layer comprises a transition layer, a primary layer, and an outer layer; and
    applying a protective layer to said bonding layer, wherein said outer layer is removed using at least one of polishing, grinding, and grit blasting prior to applying the protective layer.

10. The method as recited in claim 9, wherein said protective layer comprises a compound containing at least one of a III-column element and a Lanthanon element.

11. The method as recited in claim 10, wherein said III-column element comprises at least one of Yttrium, Scandium, and Lanthanum.

12. The method as recited in claim 10, wherein said Lanthanon element comprises at least one of Cerium, Dysprosium, and Europium.

13. The method as recited in claim 9, wherein said protective layer comprises at least one of $Al_2O_3$, Yttria ($Y_2O_3$, $Sc_2O_3$, $Sc_2F_3$, $YF_3$, $La_2O_3$, $CeO_2$, $Eu_2O_3$, and $Dy_2O_3$.

* * * * *